United States Patent
Dunga et al.

(10) Patent No.: US 7,974,133 B2
(45) Date of Patent: Jul. 5, 2011

(54) ROBUST SENSING CIRCUIT AND METHOD

(75) Inventors: Mohan Vamsi Dunga, Santa Clara, CA (US); Man Mui, Santa Clara, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 390 days.

(21) Appl. No.: 12/349,417

(22) Filed: Jan. 6, 2009

(65) Prior Publication Data

US 2010/0172187 A1 Jul. 8, 2010

(51) Int. Cl.
*G11C 11/34* (2006.01)

(52) U.S. Cl. .......... 365/185.21; 365/185.25; 365/189.05

(58) Field of Classification Search ............. 365/185.21, 365/185.25, 189.05, 205, 185.02, 185.03, 365/185.22, 189.12, 185.24, 189.07, 189.09
See application file for complete search history.

(56) References Cited

U.S. PATENT DOCUMENTS

| | | | |
|---|---|---|---|
| 6,134,147 A | 10/2000 | Kaneda | |
| 6,181,621 B1 | 1/2001 | Lovett | |
| 7,038,482 B1 | 5/2006 | Bi | |
| 7,170,791 B2 * | 1/2007 | Iwase et al. | 365/185.22 |
| 7,227,798 B2 | 6/2007 | Gupta et al. | |
| 7,372,730 B2 * | 5/2008 | Chen | 365/185.02 |
| 2004/0057287 A1 | 3/2004 | Cernea et al. | |
| 2005/0078524 A1 | 4/2005 | Hosono | |

OTHER PUBLICATIONS

International Search Report and Written Opinion, International Application No. PCT/US2009/069703.

* cited by examiner

*Primary Examiner* — Dang T Nguyen
(74) *Attorney, Agent, or Firm* — Vierra Magen Marcus & DeNiro LLP

(57) ABSTRACT

A sense amplifier is disclosed. One embodiment is a sensing circuit that includes a sensing device and a sense transistor coupled to the sensing device. A first switch that is coupled to the sense transistor and to the sensing device causes the sensing device to be charged to a first voltage that is a function of the threshold voltage of the sense transistor. One or more second switches that are coupled to the sensing device and to a target element. The second switches couple the sensing device to the target element to modify the first voltage on the sensing device and decouple the target element from the sensing device during a sense phase in which the modified first voltage is applied to the sense transistor. A condition of the target element is determined based on whether or not the sense transistor turns on in response to applying the modified first voltage to the sense transistor.

20 Claims, 7 Drawing Sheets

ROBUST SENSING CIRCUIT AND METHOD

BACKGROUND OF THE INVENTION

1. Field of the Invention

Embodiments in accordance with the present disclosure are directed to sense amplifiers.

2. Description of the Related Art

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROMs or flash memory devices have a configuration referred to as a NAND configuration in which memory cells are grouped as NAND strings with each NAND string associated with a bit line. When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. There may be two, four, eight, or even sixteen different programmed states, each characterized by a different threshold voltage level or range. It is desirable to keep the threshold voltage distribution for each state narrow so as to avoid having one programmed state being mistaken for another. More information about programming can be found in U.S. Pat. No. 6,859,397, titled "Source Side Self Boosting Technique for Non-Volatile Memory;" U.S. Pat. No. 6,917,542, titled "Detecting Over Programmed Memory;" and U.S. Pat. No. 6,888,758, titled "Programming Non-Volatile Memory," all three cited patents are incorporated herein by reference in their entirety.

The program state of the memory element can be sensed by the amount of current that flows through the memory element in response to a read voltage applied to the gate of the memory element. If the read voltage is higher than the threshold voltage, then the memory cell will turn on and conduct a significant current. The sensing of the memory cell may be performed by circuitry referred to as a sense amplifier (S/A). The function of the S/A is to sense the threshold voltage (either by voltage sensing or current sensing) of the memory cell. As an example, the S/A determines whether the memory cell is conducting a current that is larger than a specific "demarcation current." If so, the memory cell has turned on in response to the read voltage, thus implying that the threshold voltage is below the read voltage.

A memory array may have thousands, or even tens of thousands, of sense amplifiers. However, due to physical differences between the sense amplifiers, there will be slight differences in their sensing levels. The variation in sensing levels between different S/A can make it difficult to achieve a narrow voltage distribution for the various program states.

In addition, the characteristics of a sensing element (e.g., transistor) in the S/A are also a function of temperature. Typically, some form of temperature compensation may be applied. The temperature compensation is typically applied on a global basis. However, there may be some local temperature variance that is not accounted for. This local temperature variance may also lead to problems such wide voltage distributions for the various program states.

Note that the foregoing discussion is just one example in which variations between S/A can lead to problems. Therefore, it will be understood that these S/A problems are not limited to memory arrays.

SUMMARY OF THE INVENTION

A sensing circuit and method which reduce or eliminate local variations (spatial and temperature) in the sensing element of the S/A are disclosed. In one embodiment, a sensing transistor in the S/A is used to both charge and sense a sensing capacitor. This technique can reduce or eliminate problems that occur due to variations between sense amplifiers.

One embodiment is a sensing circuit comprising a sensing device and a sense transistor coupled to the sensing device. A first switch that is coupled to the sense transistor and to the sensing device causes the sensing device to be charged to a first voltage that is a function of the threshold voltage of the sense transistor. One or more second switches couple the sensing device to a target element to modify the first voltage on the sensing device and decouple the target element from the sensing device during a sense phase in which the modified first voltage is applied to the sense transistor. A condition of the target element is determined based on whether or not the sense transistor turns on in response to applying the modified first voltage to the sense transistor.

One embodiment is a memory array comprising non-volatile storage elements and sense amplifiers. Groups of the non-volatile storage elements are associated with bit lines. The sense amplifiers sense conditions of the bit lines. An individual sense amplifier includes a sensing device and a sense transistor coupled to the sensing device. A first switch that is coupled to the sense transistor and to the sensing device causes the sensing device to be charged to a first voltage that is a function of the threshold voltage of the sense transistor. One or more second switches couple the sensing device to a bit line to modify the first voltage on the sensing device and decouple the bit line from the sensing device during a sense phase in which the modified first voltage is applied to the sense transistor. A condition of the bit line is determined based on whether or not the sense transistor turns on in response to applying the modified first voltage to the sense transistor.

One embodiment is a method of sensing. The method includes charging a sensing device to a first voltage that is a function of a threshold voltage of a sense transistor, coupling the sensing device to a target element to modify the first voltage on the sensing device, applying the modified first voltage to the sense transistor, and determining a condition of the target element based on whether or not the sense transistor turns on in response to applying the second voltage to the sense transistor.

DETAILED DESCRIPTION

Figure 1:
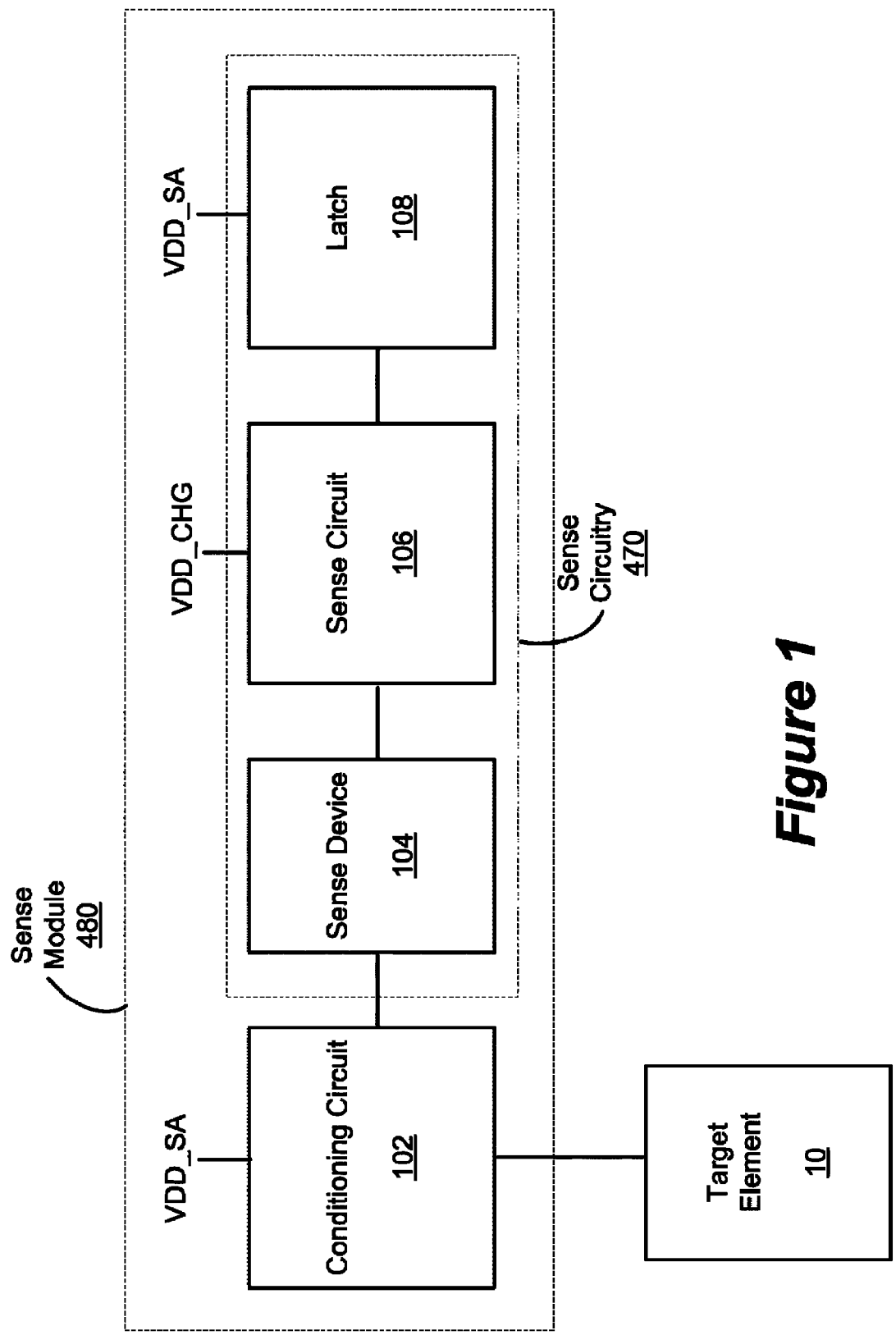
FIG. 1 is a block diagram of one embodiment of a voltage regulator.

FIG. 1 is a block diagram of one embodiment of a sense module 480 connected to a target element 10. In general, the sense module 480 contains a conditioning circuit 102, a sensing device 104, a sense circuit 106, and a latch 108. Basic operation of the sense module 480 is as follows. The sense circuit 106 develops a signal on the sensing device 104 based on the voltage VDD_CHG. For example, the sense circuit 106 is used to charge the sensing device 104 to a certain voltage level. In one embodiment, the sensing device 104 is implemented as a capacitor.

While the signal is being developed on the sensing device 104 the target element 10 can be pre-conditioned by the conditioning circuit 102. In one embodiment, the target element 10 is a memory cell in a flash memory array and the conditioning circuit 102 is a bit line precharge circuit. In that example, the bit line precharge circuit charges the bit line to a pre-determined voltage.

Then, the sensing device 104 is connected to the target element 10, which causes the signal on the sensing device 104 to change. In one embodiment, the sensing device 104 is connected to the target element 10 for a period of time referred to herein as the "integration time." If the target element 10 is a memory cell, then the conduction current of the bit line associated with the memory cell will depend on the programmed state of the memory cell. Further details of sensing conditions of a bit line are discussed herein below. The conduction current ($I_{cond}$) discharges the sensing device 104 at a rate based on the following equation:

$$I_{cond} = C dv/dt \qquad \text{Eq. 1}$$

In the above equation, C is the capacitance of the sensing device 104, dv is the change in voltage across the sensing device 104, dt is the integration time, and $I_{cond}$ is the current from the target element 10.

After the integration time is over, the sensing device 104 is connected to the sense circuit 106, which senses the signal on the sensing device 104. More particularly, the sense circuit 106 determines whether the signal on the sensing device 104 is above or below a certain level. As a specific example, the sense circuit 106 has a sense transistor which either turns on or does not turn on in response to applying the voltage from the sensing device 104 to a gate of the sense transistor.

The sense circuit 106 is connected to a latch 108, which stores a value based on the condition sensed by the sense circuit 106. As a particular example, the latch 108 has either a first state or a second state based on whether or not the sense transistor in the sense circuit 106 turned on.

If the sense transistor turned on, then it is known than the current from the target element 10 was higher than a "demarcation current." If the sense transistor does not turn on, then it is known that the current from the target element 10 was below the demarcation current. By altering the time period for which the sensing device 104 is discharged the magnitude of the demarcation current can be changed. For example, a shorter integration time equates to a higher demarcation current (see Eq. 1).

The sense circuit 106 contains one or more sense transistors that are involved in both charging the sensing device 104 to a certain voltage and in determining the voltage on the sensing device 104 after the sensing device 104 has been coupled to the target element 10. Because the same transistor(s) are used for both charging and sensing the sense device 104 the variability of threshold voltage of the sense transistor(s) is not a factor. This may reduce or eliminate problems that arise from physical variations between sense amplifiers, as well as local temperature variations.

Figure 2:
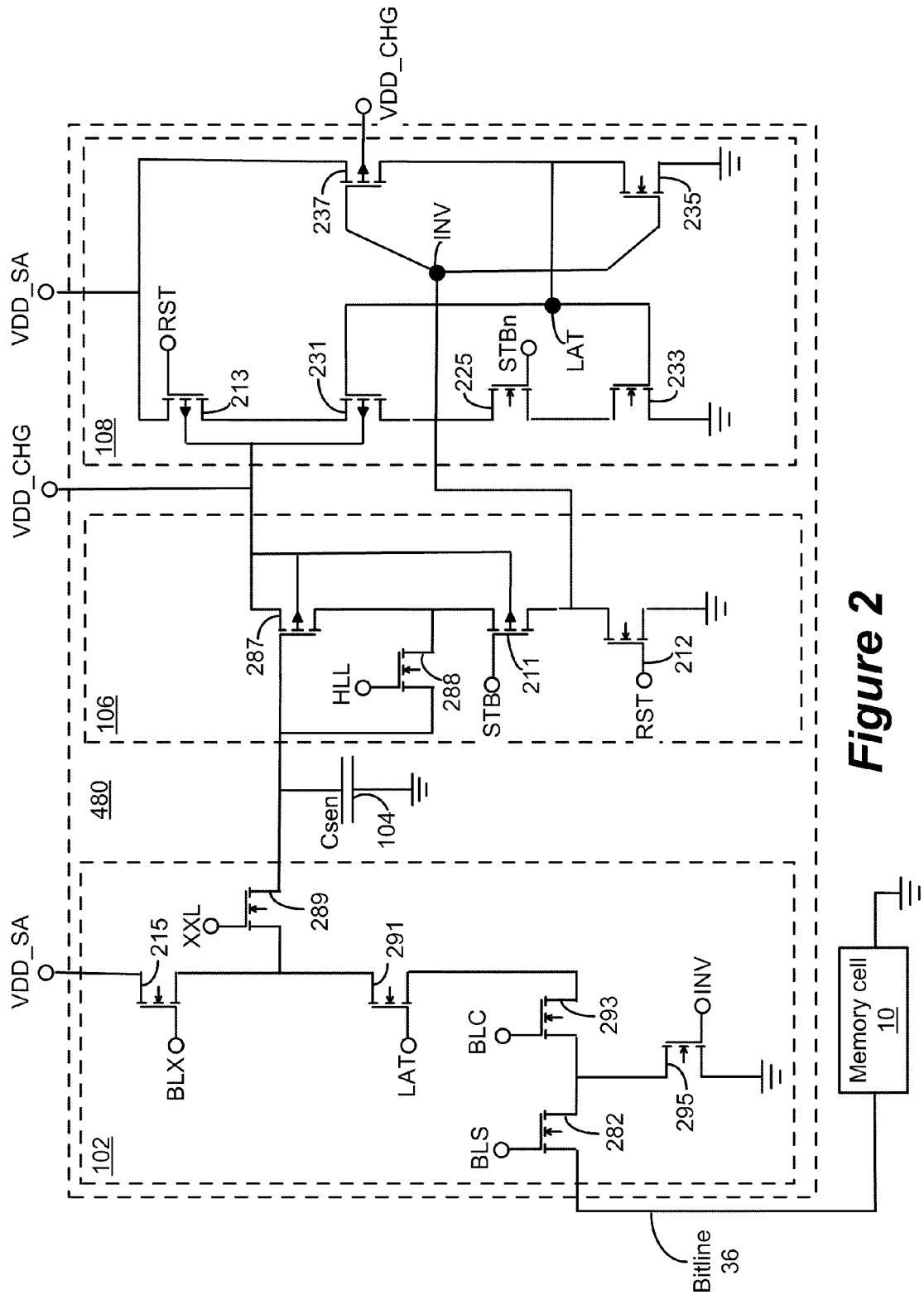
FIG. 2 is a circuit diagram of one embodiment of the voltage regulator of FIG. 1.

FIG. 2 is a circuit diagram of one embodiment of a sense module 480 connected to a bitline 36 and memory cell 10. The sense module 480 senses the conduction current of the memory cell 10 via a coupled bit line 36. The sense module 480 includes a precharge circuit 102, a sensing device 104, a sense circuit 106, and a latch 108. The circuit of FIG. 2 is one implementation of the sense module 480 of FIG. 1. The precharge circuit 102 is one implementation of the conditioning circuit 102 of FIG. 1. In an integrated circuit environment, the sensing device 104 may be a capacitor that is typically implemented with a transistor. Hence, the sensing device 104 is depicted as a capacitor in FIG. 2. The sensing device 104 has a predetermined capacitance, e.g., 30 fF, which can be selected for optimum current determination.

When the precharge circuit 102 is enabled, it brings the bit line voltage to a predetermined drain voltage appropriate for sensing. At the same time, the control gate of the memory cell 10 is set to a predetermined threshold voltage for a given memory state under consideration. This may induce a significant source-drain conduction current to flow in the memory cell 10, depending on the threshold voltage of the memory cell. The conduction current may be sensed from the coupled bit line 36. The magnitude of the conduction current is a function of the charge programmed into the memory cell 10 and the read voltage applied to the gate assuming there exists a nominal voltage difference between the source and drain of the memory cell 10.

The sense circuit 106 has a PMOS sense transistor 287, which is connected to the sensing device 104. Specifically, p-channel sense transistor 287 has its source connected to VDD_CHG and its gate connected to the sensing device 104. Switching transistor 288 connects the gate to the drain of sense transistor 287 in response to signal HLL. In effect, sense transistor 287 becomes a diode connected transistor, which results in precharging the sensing device 104 to VDD_CHG−($V_{TPSEN}$+$V_{OVX}$). The voltage $V_{TPSEN}$ is the threshold voltage of sense transistor 287 and the voltage $V_{OVX}$ is the overdrive voltage of sense transistor 287. The sensing device 104 can be precharged during the same time interval that the bit line 36 is precharged. Transistor 289, which is between the sensing device 104 and the precharge circuit 102, is shut off during the precharging interval such that the sensing device 104 is disconnected from the precharge circuit 102. Thus, neither the precharge circuit 102 nor the bitline 36 affects the sensing device 104 during the precharge phase.

After the precharge phase is over, the sensing device 104 is connected to the bitline 36 to enable sensing of the programmed state of the memory cell 10. Transistor 288 is shut off to discontinue charging of the sensing device 104 to the voltage at the source of sense transistor 287. Furthermore, transistor 289 in the precharge circuit 102 is turned on to connect the sensing device 104 to the precharge circuit 102.

At this time, transistors 291, 293, and 282 are also on and transistor 295 is off such that the sensing device 104 is connected to the bitline 36.

The sense transistor 287 serves as a discriminator or comparator of current levels. It determines whether the conduction current is higher or lower than a given demarcation current value $I_{DEMARC}$. The latch 108 is set to a certain state based on the determination of the current level. Specially, the node between transistors 211 and 212 is connected to the node labeled "INV" in the latch 108. The signal STB is a strobe signal that is used to turn on transistor 211 to cause a value to be stored in latch 108. The value at node INV in the latch 108 (as well as node LAT in the latch 108) depends on whether or not sense transistor 287 is conducting when the strobe signal STB is asserted. Specifically, node INV is pulled high if sense transistor 287 is conducting and low if sense transistor 287 is shut off during the strobe signal STB.

Sense module 480 is a multi-pass sense module. That is, the sense module 480 is designed to sense the programmed state of the memory cell 10 in multiple passes. Note that there may be one sense module 480 for each bit line 36 in a memory array. Each sense module 480 may be used to sense the programmed state of a selected memory cell 10 on each bit line 36. Thus, thousands (or even tens of thousands) of sense modules 480 may be working at the same time. An implication of this is that a very large number of bit lines 36 could be conducting a current at the same time, which can cause "source line bias." Source line bias is due to the bit line conduction currents traveling through a non-zero resistance of a common source line that is connected to the bit lines 36.

One technique for minimizing the impact of source line bias is to shut down the bit lines 36 of the memory cells 10 that have the largest conduction currents, while storing an indication that they had strong conduction currents. Then, a second pass is made to sense the programmed state of those memory cells whose bit lines were not shut off. The second sense may use a longer integration time than the first integration time, such that the demarcation current is smaller.

In the circuit of FIG. 2, the signal LAT is applied to transistor 291 and the signal INV is applied to transistor 295 in an embodiment in which multi-pass sensing is applied. If the signal INV is HIGH, this will pull down the connected bit line 36 to ground voltage. This will inhibit the conduction current flow in the memory cell 10 irrespective of the control gate voltage since there will be no voltage difference between its source and drain. If the signal LAT is LOW, this will disconnect the sensing device 104 from the bit line 36 regardless of the state of the rest of the signals that are applied to transistors in the precharge circuit 102. Note that it is not required that the sense module 480 be a multi-pass sense module.

One feature of the sense module 480 is the incorporation of a constant voltage supply to the bit line 36 during sensing in order to avoid bit line to bit line coupling. Avoiding such coupling allows sensing both even and odd bit lines together, which is referred to as all bit line (ABL) sensing. That is, since coupling between bit lines is avoided, both even and odd bit lines can be sensed at the same time. The constant voltage supply to bit line 36 is implemented by the bit line voltage clamp transistor 293. The bit line voltage clamp transistor 293 operates like a diode clamp with transistor 293 in series with the bit line 36. The gate of transistor 293 is biased to a constant voltage BLC equal to the desired bit line voltage $V_{BL}$ above its threshold voltage $V_T$. In this way, transistor 293 isolates the bit line 36 from the sensing device 104 and sets a constant voltage level for the bit line 36, such as the desired $V_{BL}$=0.5 to 0.7 volts. In general, the bit line voltage level is set to a level such that it is sufficiently low to avoid a long precharge time, yet sufficiently high to avoid ground noise and other factors. Note that it is not required that the sense module 480 have transistor 293 to provide the constant voltage supply to the bit line 36. In one embodiment, rather than sensing all bit lines together, sensing is performed on either a group of odd bit lines or even bit lines.

Further details of source line bias, multi-pass sensing, and ABL sensing are discussed in U.S. Pat. No. 7,196,931, which is hereby incorporated by reference for all purposes.

In one embodiment, there will be a page of memory cells being operated on by a corresponding number of sense modules 480. A page controller (not depicted in FIG. 2) supplies control and timing signals to each of the sense modules 480. In one embodiment, the page controller is implemented as part of the state machine 522 in the control circuitry 520 shown in FIG. 4C. In another embodiment, the page controller is part of the read/write circuits 530. The page controller cycles each of the multi-pass sense module 480 through a predetermined number of passes j=1 to N). The page control may also dictate the predetermined demarcation current value for each pass by controlling the integration time.

Various nodes in FIG. 2 have been labeled to indicate the signal that is applied to that node. Note that two different supply voltages are applied in FIG. 2. A first voltage is VDD_SA. The other voltage is VDD_CHG. VDD_SA is used as the upper rail for the precharge circuit 102 and the latch 108. Significantly, VDD_CHG is used as the upper rail for the sense circuit 106. VDD_SA is a constant voltage. However VDD_CHG varies, as depicted in the timing diagram of FIG. 3. Specifically, VDD_CHG is equal to VDD_SA+$V_{TO}$ while the sensing device 104 is being charged. However, when the sensing device 104 is being sensed by the sense transistor 287, VDD_CHG is equal to VDD_SA. Note that the sensing device 104 can only be charged to about VDD_SA minus the sum of the threshold voltage and the overdrive voltage of the sense transistor 287. However, it may be desirable to charge the sensing device 104 to about VDD_SA. Therefore, the voltage $V_{TO}$ may be approximately equal to the threshold voltage of the sense transistor 287. The voltage $V_{TO}$ may be slightly larger than the threshold voltage to account for the overdrive voltage. However, note that the overdrive voltage may only be a fraction of the threshold voltage. Note that the exact value of $V_{TO}$ is not critical. In other words, it is not required that the sensing device 104 be charged to exactly VDD_SA.

The operation and timing of the sense module 480 will be described by reference to both FIG. 2 and the timing diagrams FIGS. 3(A)-3(I). FIGS. 3(A)-3(I) are demarcated into PHASES (1)-(6).

Phase (1)

Initially a reset signal RST (FIG. 3(A)) is applied to transistor 212 in the sense circuit 106 and to transistor 213 in the latch 108. This resets the state of the latch 108 to a known state. Specifically, node LAT is reset to "HIGH" and node INV is reset to "LOW". Specifically, transistor 212 is pulled to ground, which will pull the signal INV to LOW. At the same time, transistor 213 is pulled to VDD_CHG, which raises a complimentary signal LAT to HIGH.

Phase (2)

Phase 2 is precharging the bit line using the precharge circuit 102 and precharging the sensing device 104 using the sense circuit 106.

The precharge circuit 102 is connected to the bit line 36 via an enabling signal BLS (FIG. 3(B)). The voltage clamp transistor 293 is enabled with BLC (FIG. 3(C)). At this time, transistor 215 is turned on by signal BLX (FIG. 3(D)). Furthermore, transistor 291 is turned on because LAT (FIG.

3(H)) was set to high and transistor 295 is shut off because INV (FIG. 3(H)) was set to low by the reset signal. As a result, the bitline 36 is charged based on voltage VDD_SA. In one embodiment, the precharge circuit 102 precharges the bit line 36 for a predetermined period of time. This will bring the bit line 36 to an optimum voltage for sensing the conduction current therein. The bit line 36 will be pulled up towards the desired bit line voltage as set by the bit line voltage clamp 293. The rate of pull-up will depend on the conduction current in the bit line 36. The smaller the conduction current, the faster the pull-up.

The sensing device 104 is also charged during the pre-charge phase. However, the charging of the sensing device 104 is performed with different circuit elements than the charging of the bit line 36. Specifically, elements in the sense circuit 106 are used to charge the sensing device 104, as opposed to elements in the precharge circuit 102. Transistor 288 in the sense circuit 106 is turned on by signal HLL (FIG. 3(E)), which causes a voltage to be developed on the sensing device 104. As a result, the sensing device 104 is charged to the voltage:

$$VDD\_SA + V_{TO} - (V_{thx} + V_{OVX}) \qquad \text{Eq. 2}$$

In equation 2, $V_{thx}$ is the threshold voltage of the sense transistor 287 and $V_{OVX}$ is the overdrive voltage of the sense transistor 287. As previously discussed, $VDD\_SA + V_{TO}$ is the charging voltage applied at the source of sense transistor 287. Note that the overdrive voltage will be much smaller than the threshold voltage. Moreover, the variance of $V_{OVX}$ from one sense transistor to the next should be much less than the variance in threshold voltage. Note that it is not required that the sensing device 104 be precharged for the same period of time that the bit line 36 is precharged.

Phase (3)

Figure 3:
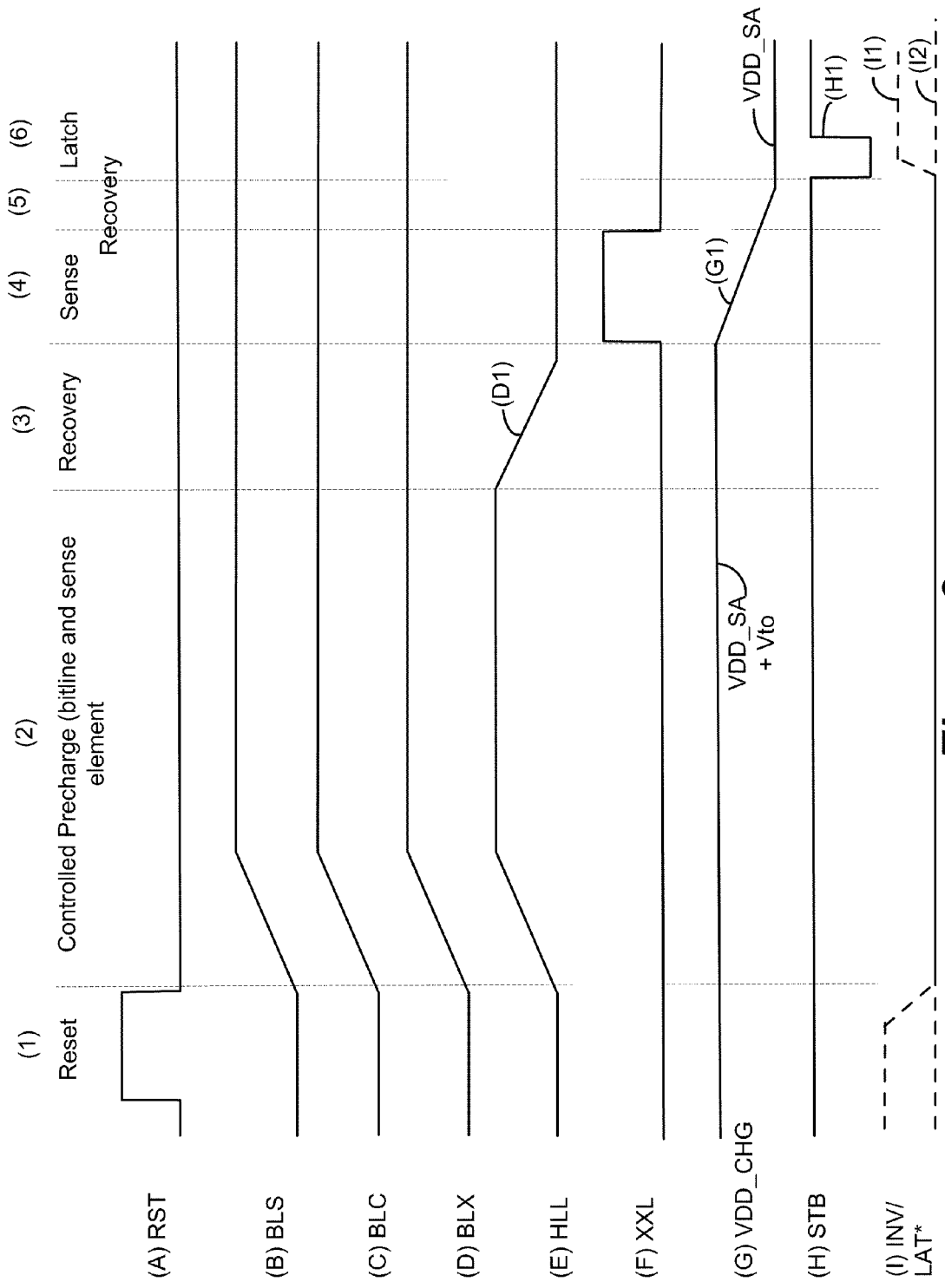
FIG. 3 is a timing diagram of one embodiment of signals input to the voltage regulator of FIG. 2.

Phase 3 is a recovery phase in which signal HLL (which was used for precharging the sense device 104) is brought down (FIG. 3(D1)).

Phase (4)

Phase 4 is a sense phase. During the sense phase the sensing device 104 is connected to the bit line 36 to discharge the sensing device 104 for a predetermined period of time (integration period). Transistor 289 is turned on by signal XXL (FIG. 3(F)) to connect the bit line 36 to the sensing device 104. The length of time for which signal XXL is active defines the integration period. Note that the voltage on the sensing device 104 is being applied to the gate of the sense transistor 287 at this time. However, the condition of the sense transistor 287 (whether or not it conducts) is not being tested yet.

After the sensing device 104 has been discharged by the conduction current $I_{COND}$ for the integration period $T_{SEN}$, the voltage $V_{SEN}$ on the sensing device 104 is given by Equation 3, where $C_{SEN}$ is the capacitance of the sensing device 104.

$$V_{SEN} = VDD\_SA + V_{TO} - (V_{thx} + V_{OVX}) - I_{COND}T_{SEN}/C_{SEN} \qquad \text{Eq. 3}$$

During phase 4 the charging voltage VDD_CHG is lowered towards VDD_SA (FIG. 3(G1)). The charging voltage VDD_CHG may or may not reach VDD_SA during the integration period.

Phase (5)

Phase 5 is an optional recovery period to allow the charging voltage VDD_CHG to settle down to VDD_SA. If VDD_CHG can settle down to be equal in magnitude to VDD_SA within the integration period (phase 4), then this recovery phase is not needed.

Phase (6)

During phase 6 the condition of the sense transistor 287 is tested and latched in latch 108. The sense circuit 106 includes two p-transistors 287 and 211 in series, which serve as a pull up for a node registering the signal INV. The p-transistor 211 is enabled by a read strobe signal STB going LOW.

The voltage $V_{SEN}$ on the sensing device 104 determines what the gate-to-source voltage of the sense transistor 287 will be (note that the two voltages are not the same). Hence, the voltage $V_{SEN}$ determines whether or not the sense transistor 287 will turn on. For the case in which the sense transistor 287 does turn on the following relationship is true.

$$VDD\_SA - V_{SEN} > V_{thx} \qquad \text{Eq. 4}$$

Equation 4 simply states the condition for the sense transistor 287 to turn on. Recall that the charging voltage VDD_CHG has been reduced to VDD_SA by this time. An implication of Equation 4 is the following.

$$(V_{thx} + V_{OVX}) + I_{CELL}T_{SEN}/C_{SEN} - V_{TO} > V_{thx} \qquad \text{Eq. 5}$$

The relationship of Equation 5 follows by combining Equations 3 and 4. Note that the threshold voltage of the sense transistor 287 can be removed from Equation 5, which is rewritten as follows.

$$I_{CELL}T_{SEN}/C_{SEN} > (V_{OVX} - V_{TO}) \qquad \text{Eq. 6}$$

Now Equation 6 can be rewritten in terms of the cell conduction current that will cause the sense transistor 287 to conduct (which can also be referred to as the demarcation current $I_{DEMARC}$).

$$I_{DEMARC} > (V_{OVX} - V_{TO})C_{SEN}/T_{SEN} \qquad \text{Eq. 7}$$

Thus, the demarcation current $I_{DEMARC}$ is not a function of the threshold voltage $V_{thx}$ of the sense transistor 287. The overdrive voltage $V_{OVX}$ is small and has very small variation from one sense transistor to the next. Furthermore, temperature variations that might otherwise arise due to $V_{thx}$ are cancelled out since the sensing is fully independent of $V_{thx}$.

The output of the sense circuit 106 is latched by the latch circuit 108 in phase 6. The latch circuit 108 is formed as a Set/Reset latch by the transistors 213, 231, 225, and 233 together with the transistors 235 and 237. The p-transistor 213 is controlled by the signal RST and the n-transistor 225 is controlled by the signal STB. As previously discussed transistor 211 is turned on by strobe signal STB (FIG. 3(H1)) and, at the same time, transistor 225 is turned on by the compliment STBn. In the event that the sense transistor 287 does turn on in this phase, then when latching signal STB strobes LOW, the output signal INV will be pulled HIGH, and will be latched by the latch 108 (FIG. 3(I1)). On the other hand, the sense transistor 287 does not turn on in this phase, the latch 108 will remain unchanged, in which case INV remains LOW (FIG. 3(I2).

In another embodiment, rather than discharging the sense capacitor 104 using the conduction current $I_{COND}$ of the bit line 36, the sense capacitor 104 is discharged based on charge sharing with the bit line 36. For example, the bit line 36 is charged to a pre-determined voltage such as 0.7 V. Then, a read voltage is applied to a gate of the memory cell 10 and read pass voltages are applied to gates of other memory cells associated with the bit line 36. The memory cell 10 will turn on if its threshold voltage is below the read voltage. The read pass voltage causes the rest of the memory cells to conduct regardless of their threshold voltages.

If the memory cell 10 turns on, the conduction current $I_{COND}$ will be large and the bit line 36 will discharge to a smaller voltage of, for example, 0.3 V. If the memory cell 10 does not turn on, the bit line voltage will remain at about 0.7 V. Thus, either a relatively high or a relatively low voltage is established on the bit line 36. However, when this voltage is established on the bit line 36, the sense capacitor 104 is not connected to the bit line 36.

After the voltage has been established on the bit line 36, a voltage is applied to the gate of transistor 282 that will turn on transistor 282 if the bit line 36 is at the low voltage and not turn on transistor 282 if the bit line 36 is at the higher voltage. For example, a voltage of about 0.4 V plus the threshold voltage of transistor 282 is applied to the gate of transistor 282. If transistor 282 turns on, then charge sharing occurs between the sense capacitor 104 and the bit line 36, which will effectively lower the voltage on the sense capacitor 104. If transistor 282 does not turn on, then the voltage on the sense capacitor 104 will not be affected.

Figure 4A:
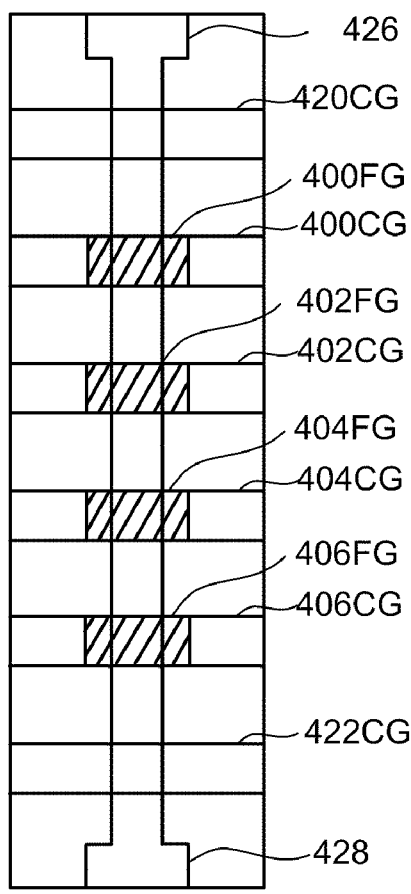
FIG. 4A is a top view of a NAND string.
Figure 4B:
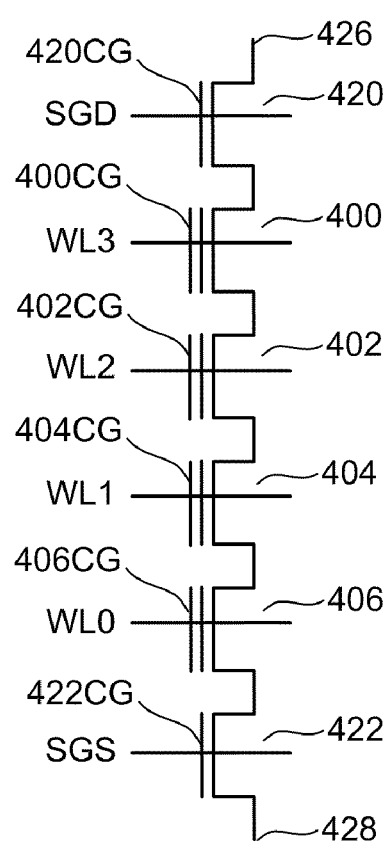
FIG. 4B is an equivalent circuit diagram of the NAND string.

In one embodiment, the sense module 480 is used within a flash memory system that uses a NAND structure. The NAND structure includes arranging multiple transistors in series, sandwiched between two select gates. The transistors in series and the select gates are referred to as a NAND string. FIG. 4A is a top view showing one NAND string. FIG. 4B is an equivalent circuit thereof. The NAND string depicted in FIGS. 4A and 4B includes four transistors 400, 402, 404 and 406 in series and sandwiched between a first (or drain side) select gate 420 and a second (or source side) select gate 422. Select gate 420 connects the NAND string to a bit line via bit line contact 426. Select gate 422 connects the NAND string to source line 428. Select gate 420 is controlled by applying the appropriate voltages to select line SGD. Select gate 422 is controlled by applying the appropriate voltages to select line SGS. Each of the transistors 400, 402, 404 and 406 has a control gate and a floating gate. For example, transistor 400 has control gate 400CG and floating gate 400FG. Transistor 402 includes control gate 402CG and a floating gate 402FG. Transistor 404 includes control gate 404CG and floating gate 404FG. Transistor 406 includes a control gate 406CG and a floating gate 406FG. Control gate 400CG is connected to word line WL3, control gate 402CG is connected to word line WL2, control gate 404CG is connected to word line WL1, and control gate 406CG is connected to word line WL0.

Note that although FIGS. 4A and 4B show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 4C:
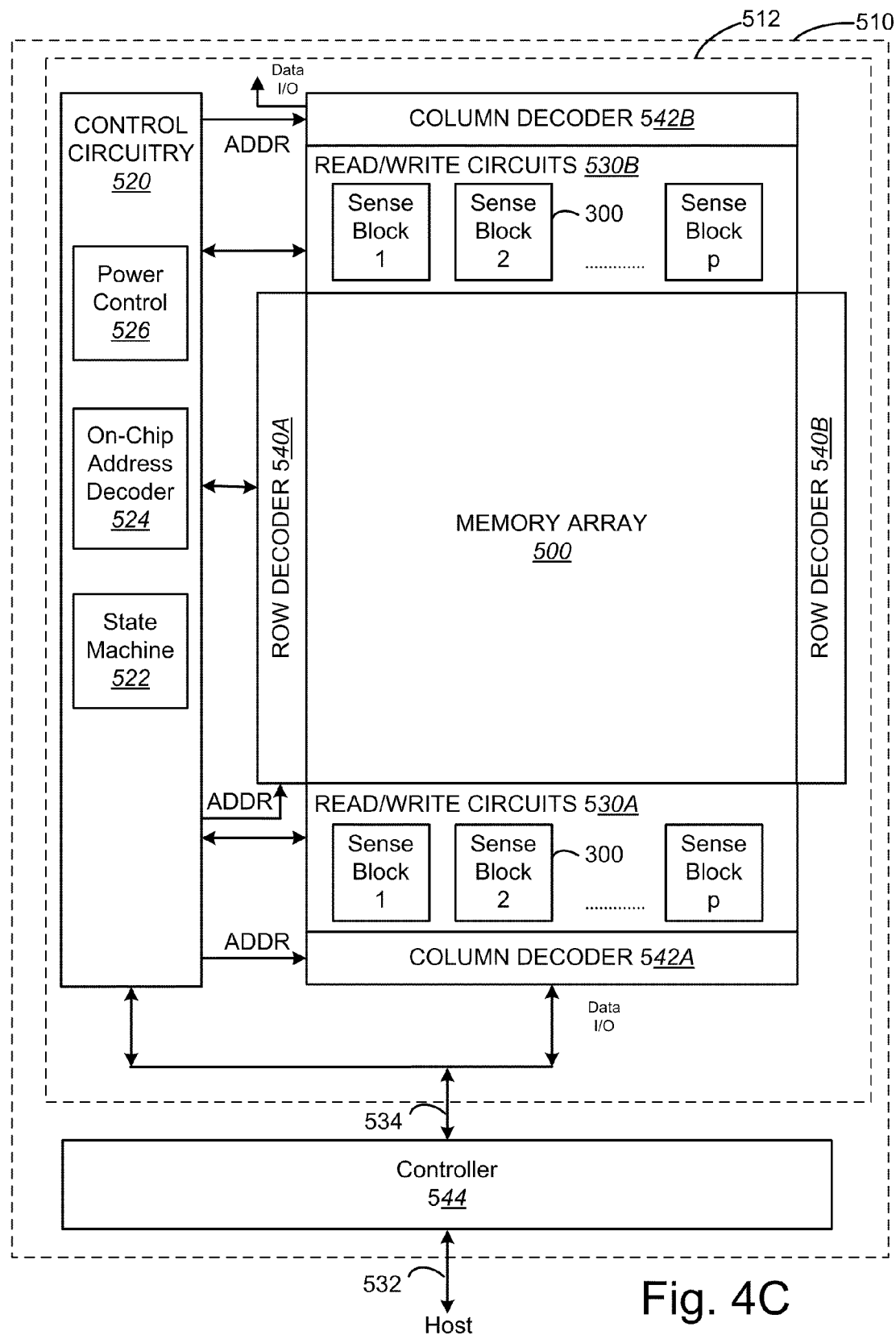
FIG. 4C is a block diagram of a non-volatile memory system.

FIG. 4C illustrates a non-volatile storage device 510 that may include one or more memory die or chips 512. Memory die 512 includes an array (two-dimensional or three dimensional) of memory cells 500, control circuitry 520, and read/write circuits 530A and 530B. In one embodiment, access to the memory array 500 by the various peripheral circuits is implemented in a symmetric fashion, on opposite sides of the array, so that the densities of access lines and circuitry on each side are reduced by half. The read/write circuits 530A and 530B include multiple sense blocks 300 which allow a page of memory cells to be read or programmed in parallel. The memory array 500 is addressable by word lines via row decoders 540A and 540B and by bit lines via column decoders 542A and 542B. In a typical embodiment, a controller 544 is included in the same memory device 510 (e.g., a removable storage card or package) as the one or more memory die 512. Commands and data are transferred between the host and controller 544 via lines 532 and between the controller and the one or more memory die 512 via lines 534. One implementation can include multiple chips 512.

Control circuitry 520 cooperates with the read/write circuits 530A and 530B to perform memory operations on the memory array 500. The control circuitry 520 includes a state machine 522, an on-chip address decoder 524 and a power control module 526. The state machine 522 provides chip-level control of memory operations. The on-chip address decoder 524 provides an address interface to convert between the address that is used by the host or a memory controller to the hardware address used by the decoders 540A, 540B, 542A, and 542B. The power control module 526 controls the power and voltages supplied to the word lines and bit lines during memory operations. In one embodiment, power control module 526 includes one or more charge pumps that can create voltages larger than the supply voltage.

In one embodiment, one or any combination of control circuitry 520, power control circuit 526, decoder circuit 524, state machine circuit 522, decoder circuit 542A, decoder circuit 542B, decoder circuit 540A, decoder circuit 540B, read/write circuits 530A, read/write circuits 530B, and/or controller 544 can be referred to as one or more managing circuits.

Figure 4D:
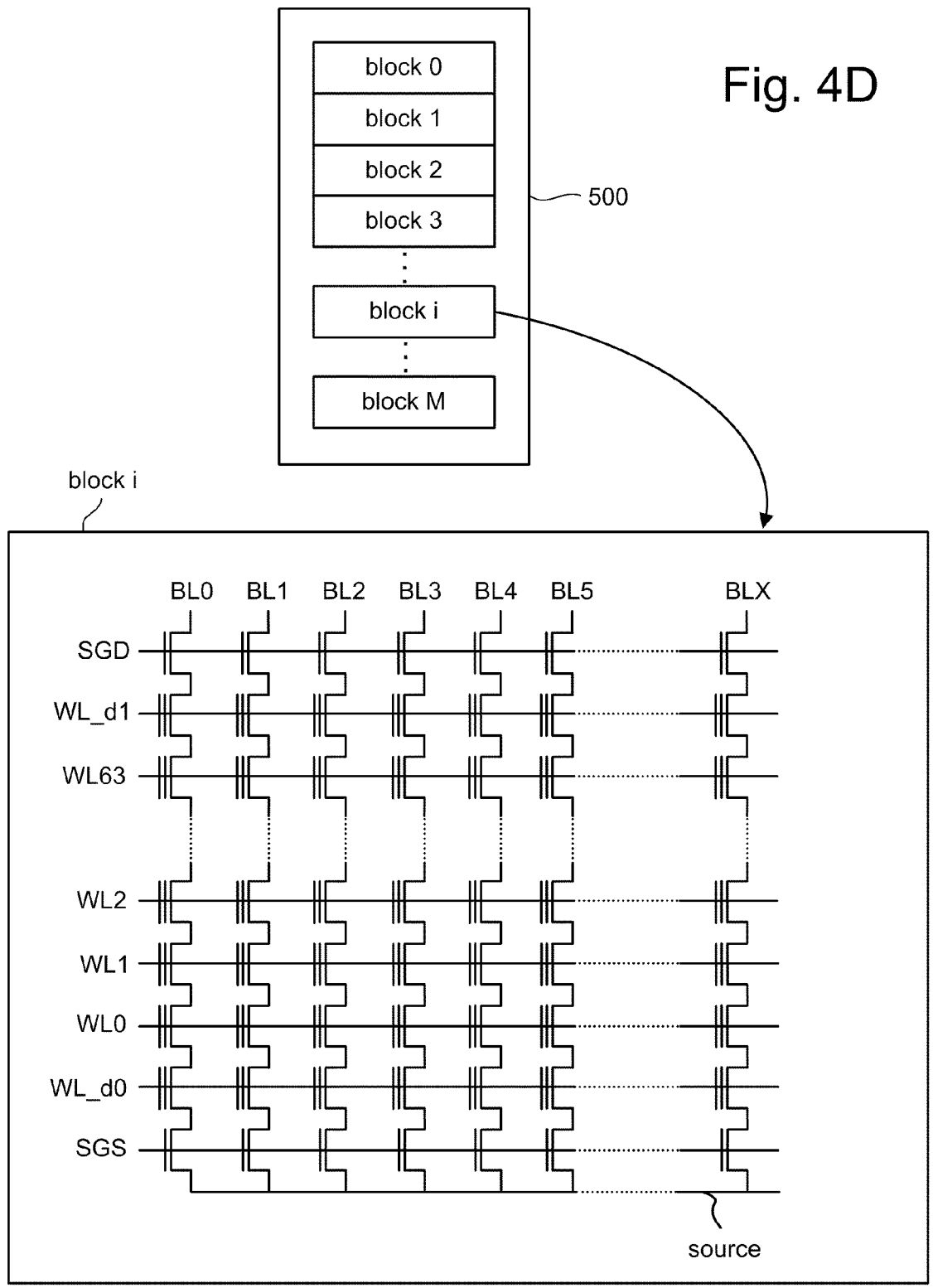
FIG. 4D is a block diagram depicting one embodiment of a memory array.

FIG. 4D depicts an exemplary structure of memory cell array 500. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4D shows more details of block i of memory array 500. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or less than 64 data memory cells and two dummy memory cells. Data memory cells can store user or system data. Dummy memory cells are typically not used to store user or system data. Some embodiments do not include dummy memory cells.

Figure 4E:
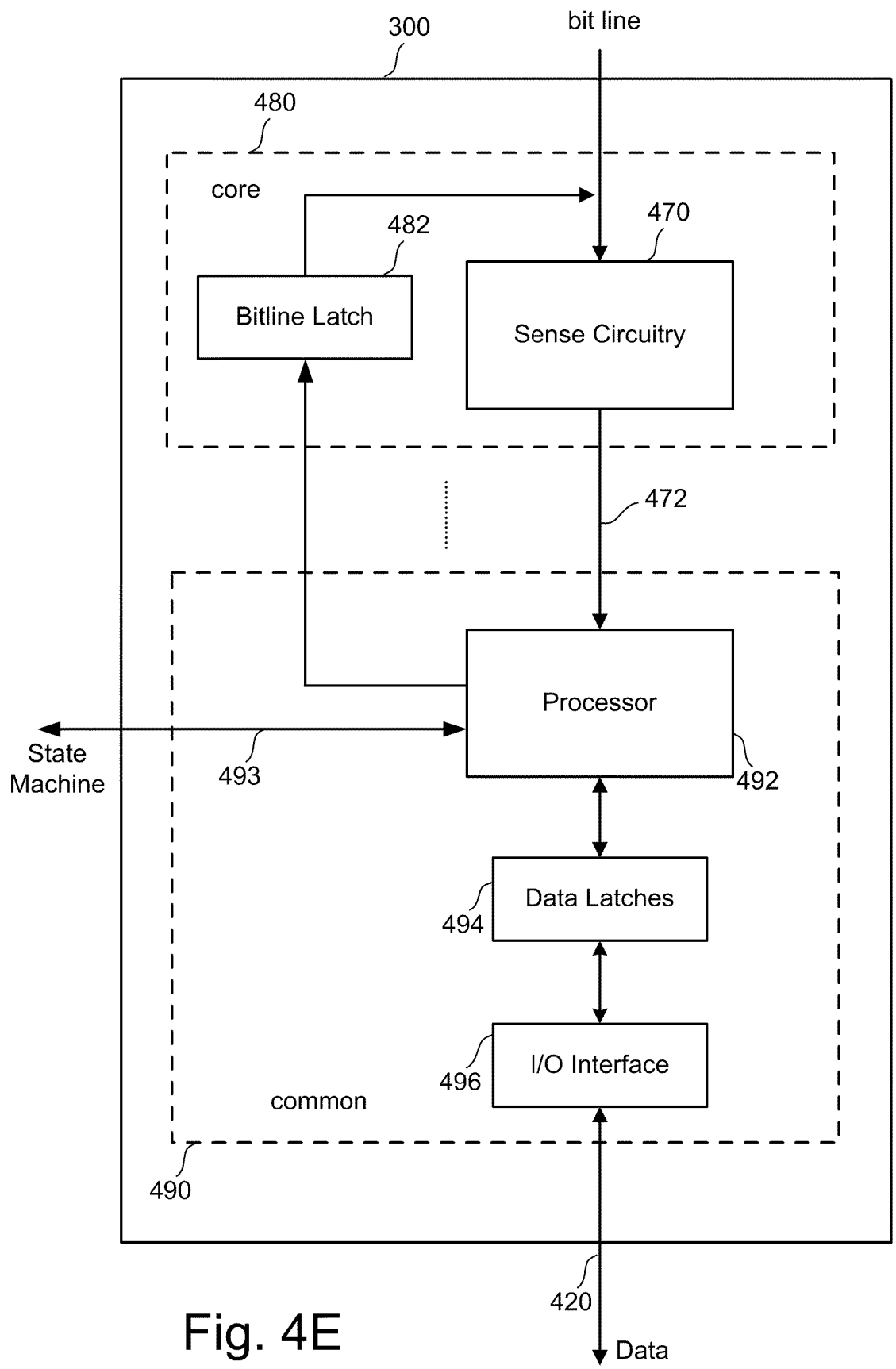
FIG. 4E is a block diagram depicting one embodiment of a sense block.

FIG. 4E is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 522 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4E) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A sensing circuit comprising:
   a sensing device;
   a sense transistor coupled to the sensing device, the sense transistor has a threshold voltage;
   a first switch coupled to the sense transistor and to the sensing device, the first switch causes the sensing device to be charged to a first voltage that is a function of the threshold voltage of the sense transistor; and
   one or more second switches that are coupled to the sensing device and to a target element, the one or more second switches couple the sensing device to the target element to modify the first voltage on the sensing device, the one or more second switches decouple the target element from the sensing device during a sense phase in which the modified first voltage is applied to the sense transistor;
   a condition of the target element is determined based on whether or not the sense transistor turns on in response to applying the modified first voltage to the sense transistor.

2. A sensing circuit as recited in claim 1, wherein the target element is a non-volatile storage element that is associated with a bit line, and further comprising a precharge circuit that precharges the bit line while the first switch causes the sensing device to be charged to the first voltage.

3. A sensing circuit as recited in claim 2, wherein the one or more second switches de-couple the precharge circuit from the sensing device when the sensing device is charged to the first voltage.

4. A sensing circuit as recited in claim 2, wherein:
   a second voltage is applied to the precharge circuit as a supply voltage; and
   a third voltage is applied to the sense transistor when the sensing device is charged to the first voltage, the third voltage is greater than the second voltage.

5. A sensing circuit as recited in claim 4, wherein:
   the third voltage is reduced to the second voltage prior to the sense phase such that the third voltage equals the second voltage during the sense phase.

6. A sensing circuit as recited in claim 4, wherein the third voltage is equal to the second voltage plus an offset voltage when charging the sensing device and is equal to the second voltage when applying the modified first voltage to the sense transistor.

7. A sensing circuit as recited in claim 6, wherein the offset voltage is approximately a turn on voltage of the sense transistor.

8. A sensing circuit as recited in claim 1, wherein:
the sense transistor has a gate, a source, and a drain;
the sensing device is coupled to the gate of the sense transistor;
the source of the sense transistor is coupled to a charging voltage; and
the first switch connects the gate to the drain in order to provide a path to charge the sensing device.

9. A storage device comprising:
a plurality of non-volatile storage elements, groups of the non-volatile storage elements are associated with bit lines;
a plurality of sense amplifiers, the sense amplifiers sense conditions of the bit lines, an individual sense amplifier includes:
a sense capacitor;
a sense transistor coupled to the sense capacitor, the sense transistor has a threshold voltage;
a first switch coupled to the sense transistor and to the sense capacitor, the first switch causes the sense capacitor to be charged to a first voltage that is a function of the threshold voltage of the sense transistor;
one or more second switches that are coupled to the sense capacitor and to a first bit line of the bit lines, the one or more second switches couple the sense capacitor to the first bit line to modify the first voltage on the sense capacitor, the one or more second switches decouple the first bit line from the sense capacitor during a sense phase in which the modified first voltage is applied to the sense transistor; and
a latch to store a condition of the first bit line based on whether or not the sense transistor turns on in response to applying the modified first voltage to the sense transistor.

10. A storage device as recited in claim 9, wherein the individual sense amplifier further includes a precharge circuit that precharges the first bit line while the first switch causes the sense capacitor to be charged.

11. A storage device as recited in claim 10, wherein the one or more second switches de-couple the precharge circuit from the sense capacitor when the sense capacitor is charged to the first voltage.

12. A storage device as recited in claim 10, wherein:
a second voltage is applied to the precharge circuit as a supply voltage;
a third voltage is applied to the sense transistor when the sense capacitor is charged to the first voltage, the third voltage is greater than the second voltage; and
the third voltage is equal to the second voltage during the sense phase.

13. A storage device as recited in claim 11, wherein the third voltage is equal to the second voltage plus an offset voltage when charging the sense capacitor and is equal to the second voltage when applying the modified first voltage to the sense transistor.

14. A storage device as recited in claim 13, wherein offset voltage is approximately a turn on voltage of the sense transistor.

15. A storage device as recited in claim 9, wherein:
the sense transistor has a gate, a source, and a drain;
the sense capacitor is coupled to the gate of the sense transistor;
the source of the sense transistor is coupled to a charging voltage; and
the first switch connects the gate to the drain in order to provide a path to charge the sense capacitor.

16. A method of sensing, said method comprising:
charging a sensing device to a first voltage that is a function of a threshold voltage of a sense transistor;
coupling the sensing device to a target element to modify the first voltage on the sensing device;
applying the modified first voltage to the sense transistor; and
determining a condition of the target element based on whether or not the sense transistor turns on in response to applying the second voltage to the sense transistor.

17. A method as recited in claim 16, further comprising precharging a bit line while charging the sensing device to the first voltage, the target element is a non-volatile storage element, the bit line is associated with the non-volatile storage element.

18. A method as recited in claim 16, wherein the charging a sensing device to a first voltage includes connecting a gate to a drain of the sense transistor, the sensing device is coupled to the gate of the sense transistor, a source of the sense transistor is coupled to a charging voltage.

19. A method as recited in claim 18, further comprising reducing the charging voltage to a supply voltage prior to applying the modified first voltage to the sense transistor.

20. A method as recited in claim 16, wherein the coupling the sensing device to a target element includes:
coupling a signal from the target element to the sensing device for a period of time to discharge a voltage on the sensing device.

* * * * *